United States Patent [19]

Dutasta

[11] Patent Number: 4,472,685
[45] Date of Patent: Sep. 18, 1984

[54] PHASE-LOCKED LOOP FREQUENCY DEMODULATOR AND FREQUENCY SYNTHESIZER

[75] Inventor: Rémi Dutasta, Angers, France

[73] Assignee: Thomson-Brandt, Paris, France

[21] Appl. No.: 256,836

[22] Filed: Apr. 23, 1981

[30] Foreign Application Priority Data

Apr. 25, 1980 [FR] France ................. 80 09387

[51] Int. Cl.³ .......................... H03D 3/00; H03L 7/18
[52] U.S. Cl. .................................. 329/50; 329/122; 331/11; 331/23
[58] Field of Search ............ 329/122, 124, 50; 331/11, 23; 455/208, 249, 260, 263, 340, 195, 234

[56] References Cited

U.S. PATENT DOCUMENTS

| | | | |
|---|---|---|---|
| 3,212,023 | 10/1965 | Broadhead | 331/11 |
| 3,657,661 | 4/1972 | Jarger | 331/23 X |
| 4,358,791 | 11/1982 | French | 455/260 X |

FOREIGN PATENT DOCUMENTS

| | | |
|---|---|---|
| 1443419 | 5/1966 | France |
| 2115283 | 7/1972 | France |
| 2175671 | 10/1973 | France |
| 2304213 | 10/1976 | France |

OTHER PUBLICATIONS

Zakheim, J., "La boucle à verrouillage de phase", Toute Lélectronique, No. 419, Mar. 1977, pp. 43-50.
Krajensky, K., "RF Mixer with PIN Diodes for AGC to be used in Hi-Fi Models", Radio Mentor Electronic, vol. 42, No. 6, pp. 220-222, Jun. 1976.
Hilliker, S., "A Uniquely Simplified TV Tuning System Incorporating an Equally Unique Digital Automatic and Manual Fine Tuning Scheme", IEEE Trans. on Consumer Electronics, vol. 22, No. 1, pp. 61-67, (Feb. 1976).
Douville, R. J., "A 12-Ghz Low-Cost Earth Terminal for Direct TV Reception from Broadcast Satellites", IEEE Trans. on Microwave Theory & Techniques, vol. MTT25, No. 12, pp. 1000-1008, (Dec. 1977).
Anon., "Feedback PLL for FM", Elektor, vol. 2, No. 1, pp. 110-119, (Jan. 1976).

Primary Examiner—Stanley D. Miller
Assistant Examiner—W. R. Paxman
Attorney, Agent, or Firm—Cushman, Darby & Cushman

[57] ABSTRACT

A combined phase-locked loop frequency demodulator and frequency synthesizer for frequency-modulated wave receivers using two phase-locked loops respectively for synthesis and for demodulation. In this device, the frequency-modulated signal is applied to one of the inputs of a first phase comparator whose other input is coupled to the output of a voltage-controlled oscillator, which output is also coupled, through a prescaler and a programmable frequency divider mounted in cascade, to one of the inputs of a second phase and frequency comparator whose other input is coupled to the output of a crystal-controlled reference oscillator. The output of the first comparator is coupled by means of a first low-pass or bandpass filter to a first input of an analog adder whose second input is coupled by means of a second low-pass filter, having a relatively low upper cut-off frequency, to the output of the second comparator. The output of the adder which combines the signals from the two filters is connected to the frequency-control input of the voltage-controlled oscillator. The output of the first filter supplies the demodulated signal and thus constitutes the output of the frequency demodulator, whose phase-locked loop is combined with the phase-locked loop of the frequency synthesizer, which selects the frequency of the modulated carrier wave, by means of the adder and the single voltage-controlled oscillator which are the common elements of both phase-locked loops.

6 Claims, 2 Drawing Figures

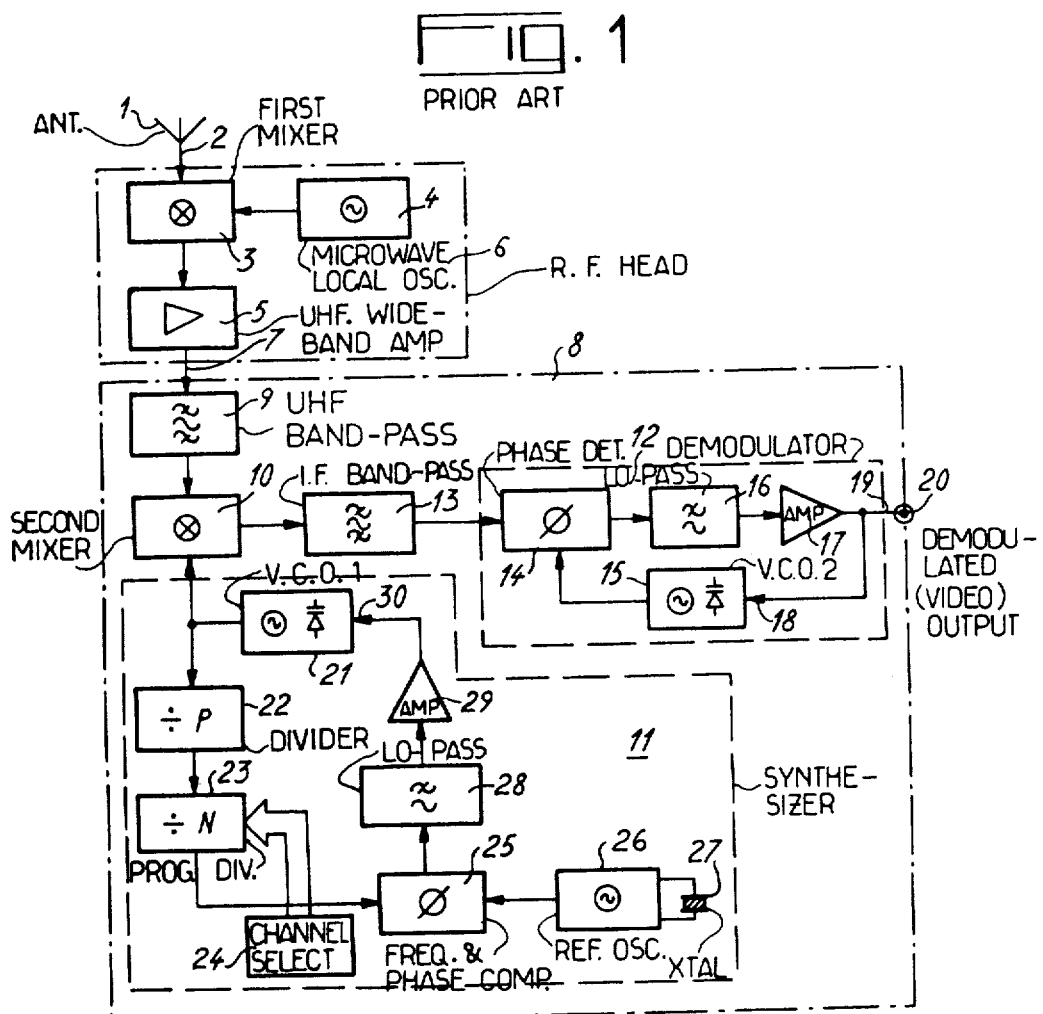

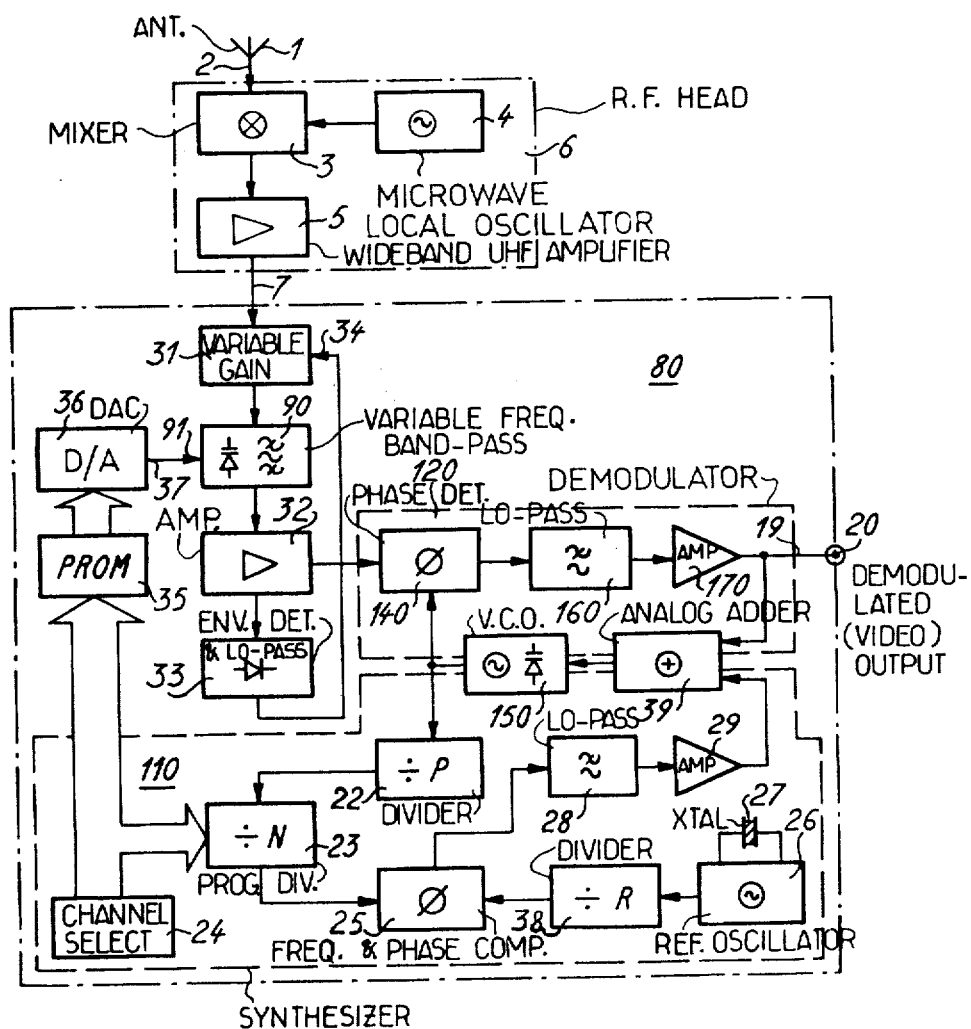

PHASE-LOCKED LOOP FREQUENCY DEMODULATOR AND FREQUENCY SYNTHESIZER

BACKGROUND OF THE INVENTION

The invention relates to a phase-locked loop frequency demodulator and frequency synthesizer for a frequency-modulated wave receiver of the type comprising two phase-locked loops or "PLL".

The use of phase-locked loops as frequency synthesizers in tuners (channel selectors) of radio frequency receivers is well-known and described, for example, in an article by BREEZE on pages 24 to 32 of the the U.S. periodical "IEEE TRANSACTIONS ON CONSUMER ELECTRONICS", vol. CE-24 No. 1 of February 1978, or by HILLIKER on pages 62 to 68 of Vol. CE-22, No. 1 of the same periodical, dated February 1976, or in the FR-A Nos. 2,236,318, 2,327,670 and 2,257,105 patent publications. Furthermore, their use as frequency-modulated wave demodulators is also well-known and described, for example, in articles by NIEPOLD on pages 245 to 253 of the German review "ARCHIVE DER ELEKTRONIK UND ÜBERTRAGUNGSTECHNIK", vol. 31, section 6, of June 1977, or by DOSWALD and WEHRLI on pages 96 and 106 of the Swiss review "TECHNISCHE MITTEILUNGEN PTT", vol. 52, No. 3, of March 1974, and by BREMENSON and DEHAENE on pages 479 to 509 of the French review "REVUE TECHNIQUE THOMSON-CSF", Vol. 10, No. 3, of September 1978, as well as in the corresponding FR-A No. 1,222,053 and U.S. Pat. No. 3,069,625 patent publications, as well as in the FR-A No. 1,443,419 or FR-A No. 2,180,001 patent applications.

The two above-mentioned uses for the phase-locked loop have also been described in articles by ZAKHEIM on pages 43 to 50 of the French review "TOUTE L'ELECTRONIQUE" No. 419 of March 1977 or by MURTHI on pages 59 to 64 of the U.S. review "EDN", vol. 22, No. 16, dated Sept. 5, 1977.

According to the prior art, frequency-modulated wave receivers may use two independent, complete phase-locked loops, one for frequency synthesis to tune the local oscillator of a heterodyne converter and the other for frequency demodulation, as illustrated in FIG. 1 of the accompanying drawings, which will be described further on. Such an arrangement has the disadvantage, that when the bandpass filtering elements ahead of the phase-locked loop demodulator input are insufficiently selective and/or when another received signal in a neighboring frequency channel is sufficiently strong, to allow the demodulator loop to lock onto the frequency of this other signal which is different from that chosen by means of the programmable divider of the frequency synthesizer, whose dividing factor is displayed as the number of the channel received. This latching onto a frequency different from the desired one is also possible when the voltage-controlled oscillator of the phase-locked loop demodulator is tunable by means of a voltage from a potentiometer or from a digitally controlled tuning voltage synthesizer, the tuning voltage being used to reverse bias the variable capacitor diode in the voltage controlled oscillator.

The combined arrangement of the tuning device and of the demodulator of the present invention avoids this disadvantage while providing an economy of means.

An oscillator circuit with digital stabilization is known and described in the publication U.S. Pat. No. 3,212,023, in which a first phase-locked loop used for frequency synthesis and comprising a first narrow-band low-pass loop filter, determines the oscillation frequency of a voltage-controlled oscillator by comparing the frequency of a wave supplied by a switchable divider fed by this oscillator, to a constant-frequency reference wave. This circuit further comprises a second, so-called auxiliary, phase-locked loop in which the phase of the wave supplied by the voltage-controlled oscillator is compared to that of a higher harmonic of the reference wave and the signal resulting from this comparison is applied through a second high-frequency loop filter, added to that from the first filter of the synthesis loop, to the frequency control input of the oscillator. Thus, the spurious phase modulation or "jitter" of the wave supplied by the oscillator, due to the switchable divider of the synthesis loop, can be reduced or eliminated.

SUMMARY OF THE INVENTION

It is an object of the invention to provide a combined phase-locked loop frequency demodulator and frequency synthesizer for a frequency-modulated carrier-wave receiver, of the type comprising two phase-locked loops both acting on a single voltage-controlled variable-frequency local oscillator.

According to the invention, there is provided a frequency demodulator and synthesizer device for a frequency-modulated carrier-wave receiver, comprising first and second phase-locked loops acting on a single voltage-controlled oscillator, said first loop being a conventional frequency synthesizer loop for selecting a frequency corresponding to one of a plurality of received modulated carrier waves, which is to be demodulated, said first loop being combined with said second loop, which is a conventional demodulator loop having a first phase comparator receiving at its signal input at least said one of the modulated carrier waves and at its other input, the wave supplied by the oscillator, said demodulator loop providing a demodulated signal at an output thereof.

In an advantageous embodiment, the combined phase-locked loop frequency demodulator and synthesizer of the preceding paragraph comprises, furthermore, inserted in the path of the modulated wave received, ahead of the signal input of the first phase comparator, a voltage-tunable bandpass filter controlled by a DC tuning voltage which is obtained from the digital signal controlling the dividing factor of the programmable divider which, applied to the parallel address inputs of a preprogrammed read-only memory, generates at the parallel data outputs thereof, another digital signal applied to the parallel inputs of a digital-to-analog converter. The single output of this converter connected to the tuning control input of the voltage-tunable filter, supplies thereto a tuning voltage such that the central frequency of the passband of this filter corresponds substantially to the frequency of the voltage-controlled oscillator in the absence of modulated waves at the input of the first comparator.

According to a further embodiment of the invention, the combined phase-locked loop frequency demodulator and synthesizer further includes, inserted in the path of the received modulated carrier waves, ahead of the signal input of the first phase comparator, a voltage-controlled variable-gain stage whose gain control input is fed by a voltage proportional to the amplitude of the modulated carrier waves at said signal input, whereby to maintain a substantially constant amplitude thereof at this signal input.

DESCRIPTION OF THE DRAWINGS

The invention will be better understood and other objects, features and advantages thereof will become apparent from the following description and accompanying drawings, given by way of example, in which:

FIG. 1 is a partial block diagram of a frequency-modulated wave receiver of the prior art comprising a heterodyne converter tuning device fed by a frequency synthesizer-controller local oscillator including a first phase-locked loop, and a frequency demodulator with a second phase-locked loop, the two loops being independent of each other; and FIG. 2 is a partial block diagram of a frequency-modulated wave receiver comprising a combined frequency demodulator and synthesizer, in accordance with the present invention.

DESCRIPTION OF THE PREFERRED EMBODIMENTS

In the above figures which represent frequency-modulated wave receivers intended particularly for the direct reception of television signals transmitted by a stationary satellite which forms one of the possible modern applications of such a device, the corresponding elements have been given the same reference numbers.

In FIG. 1, there is shown schematically a part of a frequency-modulated wave receiver usable for microwave space (satellite), troposheric or other links, whose carrier waves have frequencies of several gigahertz (GHz or kMHz), such as for example those situated in the 12 GHz-band defined by the CCIR Conference at Geneva in 1977, as the one going from 11.7 to 12.3 GHz which was used experimentally in Canada for testing the possibility of direct reception of the signal transmitted by a geostationary broadcasting satellite (for television programs). This experiment and the receivers used have been described in numerous articles, such as those by FREEMAN on pages 234 to 236 of the British review "THE RADIO AND ELECTRONIC ENGINEER", vol. 47, No. 5 of May 1977; by DOUVILLE in the U.S. review "IEEE TRANSACTIONS ON MICROWAVE THEORY AND TECHNIQUES", vol. MTT-25, No. 12 of December 1977; by KONISHI on pages 720 to 725 of vol. MTT-26, No. 10 of the preceding review, of October 1978; by HAWKER on pages 27 to 35 of the British review "IBA TECHNICAL REVIEW" No. 11, of July 1978; and by HALAYKO and HUCK on pages 112 to 119 of the U.S. review "IEEE TRANSACTIONS ON CABLE TELEVISION", vol. CATV-3, No. 3, of July 1978, for example.

Such a system for the individual reception of a television signal frequency-modulating a carrier wave which is retransmitted by a satellite, generally comprises an antenna 1 shown symbolically, of the so-called parabolic type, i.e. comprising a reflector in the shape of a paraboloid of revolution having a diameter between 0.7 and 1.6 meters for example, which reflects the incident electromagnetic waves towards its focus. In the focus is situated the opening of a horn or a dipole picking up the energy focused by the reflector and transmitting it through a waveguide to a low-noise heterodyne mixer or converter 3, equipped with at least one Schottky diode (made from gallium arsenide), or a balanced mixer having two or four such diodes, for transposing the carrier frequency from the 12 GHz-band to a lower frequency. The mixer-transposer 3 is fed for this purpose, moreover, by a first local oscillator 4 with very stable frequency, such as an oscillator equipped with a Gunn diode and having a resonating cavity which may, possibly, be excited by stable frequency signals coming from a quartz oscillator through at least one frequency multiplier so as to supply a 10.8 GHz wave, for example (see, for example, the above-mentioned articles by KONISHI, by HALAYKO et al., by DOSWALD et al., or by FREEMAN). The output of mixer 3 which transposes the frequencies of the carrier waves from the 11.7 to 12.2 GHz-band to a frequency band ranging from 0.9 to 1.4 GHz, for example (see the articles by HAWKER, KONISHI and HALAYKO et al.), supplies a first intermediate frequency channel having a bandwidth including all the channels of the microwave band. This first intermediate frequency channel allows all the receiver carrier waves to be transmitted by means of a first intermediate frequency amplifier 5 having a large bandwidth ($B \geq 500$ MHz), fed from the output of the mixer-converter 3. The above-described elements 3, 4 and 5 are generally contained in a screened (and sealed) casing containing the outdoor unit or radio-frequency head 6 of the receiver, which is mounted to the rear of the reflector of antenna 1 and connected, insofar as the signals at the first intermediate frequency supplied by the output of amplifier 5, as well as DC supply voltages are concerned, to to the indoor unit 8 of the receiver, by means of a coaxial interconnection cable 7. The first intermediate frequency may also occupy a band around 450 MHz (see the article by HAWKER) depending on the number of adjacent channels to be received.

In the above-mentioned articles by FREEMAN, KONISHI or HAWKER, the receiver further comprises a second heterodyne mixer-converter 10, one input of which is fed by the first intermediate frequency signals, possibly through a first bandpass filter 9, for example, and whose other input is fed by a second tunable local oscillator 11 for selecting the channel containing the frequency-modulated wave which is to be transmitted to a frequency demodulator 12 through a second filtering and/or selective amplifying element 13, preferably, comprising an efficient automatic gain control device, whose bandwidth centered about a second intermediate frequency (situated approximately at 120 MHz, for example), corresponds substantially to the entire spectrum of a modulated carrier wave ($\geq$ about 20 MHz) frequency-modulated by the television signal (composite video and sound).

The first bandpass filter 9 is either fixed tuned having a large bandwidth (500 MHz or 200 MHz) centered on the first intermediate frequency (1.15 GHz or 410 MHz, for example), or having a narrow pass-band (at least 20 MHz) which is tunable inside the above-mentioned wide band, by means of a tuning voltage reverse-biasing one or more variable capacitor diodes. The first filter 9 may then be tuned simultaneously with the local oscillator 11, formed here by a conventional phase-locked loop (PLL) frequency synthesizer, which will be described further on.

The frequency demodulator 12 is fed from the output of the second intermediate frequency filter or amplifier 13, connected to its input which is formed here by a first or signal input of a first phase comparator 14 whose second input is fed from the output of a first voltage-controlled oscillator (VCO) 15. The output of the first phase comparator 14 feeds a first low-pass filter 16 whose cut-off frequency should not be lower than that of the highest frequency component of the signal frequency-modulating the carrier wave. The output of the first low-pass filter 16 feeds, through a first DC amplifier 17, on the one hand, the frequency control input 18 of the voltage-controlled oscillator (VCO) 15 and, on the other hand, the output 19 of the demodulator 12 supplying the demodulated signal which corresponds substantially to the signal modulating the carrier wave. Demodulator 12 thus forms a first phase-locked loop whose oscillator 15 follows the frequency deviations of the transposed frequency-modulated carrier wave by means of a control signal applied to its control input 18, which is derived from the error signal supplied by the first phase comparator 14 and which corresponds to the modulating signal (except for a possible DC level error). The use of a phase-locked loop frequency demodulators in satellite links has been recommended in the above-mentioned article by DOSWALD et al. (page 108).

The output 19 of the frequency demodulator 12 is connected to an output shown by the reference 20, which supplies the composite color video signal as well as a sound subcarrier which is frequency-modulated (5.14 MHz - see FREEMAN, HALAYKO or HAWKER) by the sound signal (audio-frequency).

The second local oscillator 11 or frequency synthesizer is arranged in the way described in the above-mentioned articles by HILLIKER and BREEZE. It comprises a second voltage-controlled oscillator (VCO) 21 whose output feeds, on the one hand, one of the inputs of the second heterodyne mixer 10 and, on the other hand, the input of a prescaler 22 having a dividing factor (P) which is a fixed integer, whose output is connected to the input of a digitally-controlled programmable divider or counter 23.

The dividing factor (N) of the programmable divider 23, which is a variable integer, is controlled by words composed of binary digits simultaneously applied to its parallel-control inputs. This control signal or word is supplied by a conventional digital control circuit 24 comprising a decimal keyboard and means for displaying the channel number which has been selected, by successive actuation (pressing down) of the keys of this keyboard.

The output of the programmable divider 23 is connected to a first input of a second phase (and frequency) comparator 25 whose second input is supplied by a reference oscillator 26 whose very stable frequency $F_Q$ is controlled by a crystal 27. This frequency $F_Q$ determines the unit step by which the frequency of the local oscillator may vary, whose frequency $F_{LO}$ is equal to $P.N.F_Q$, where P is a constant integer, N is a variable integer and $F_Q$ is a constant number.

The output of the second phase comparator 25 feeds a second low-pass filter 28 (or integrator) which in turn feeds a second DC amplifier 29, which two elements may be combined together to form an active low-pass filter including an integrated operational amplifier whose relatively low cut-off frequency determined by its feedback network, for example, depends on the desired locking speed during a change of channel. The output of the second DC amplifier 29 is connected to the frequency control input 30 of the second voltage-controlled oscillator 21 (VCO).

As was mentioned above, if the second filter 13 and, possibly, the first intermediate-frequency bandpass filter 9 are insufficiently selective and/or when the amplitude of the selected modulated wave is too low or zero, the phase-locked loop demodulator 12 may latch onto the signal of an adjacent channel or onto a product of any intermodulations whatsoever and the signal supplied by the output 20 is not the one transmitted by the channel displayed by the digital control circuit 24.

In FIG. 2, there is shown schematically a similar receiver having a combined arrangement of a phase-locked loop frequency demodulator and synthesizer tuning device in accordance with the invention, which ensures that the loop of the demodulator only latches onto the carrier frequency of the channel selected by means of the programmable divider.

The output of the radio-frequency head 6 of the receiver of FIG. 2 is also connected by cable 7 to the indoor unit 80 whose first stage is a variable-gain stage 31 having a large bandwidth (500 MHz) such as a PIN diode attenuator, for example, whose attenuation is controlled by a DC voltage applied to its gain control input 34. The control of variable attenuator 31 may also be obtained digitally by applying the detected amplitude of the carrier to an analog-to-digital converter (not shown). The output of attenuator 31 feeds a tunable bandpass filter 90 which can be tuned inside the 0.9 to 1.4 GHz-band. This intermediate-frequency tunable bandpass filter 90 has a relatively narrow bandwidth ($\geq 20$ MHz) which only lets the modulated carrier wave of a single channel pass. The tuning of filter 90 is obtained by means of a DC tuning voltage applied to its tuning control input 91, which biases the variable capacitor diode(s) which it comprises, so that the central frequency of its passband corresponds substantially to the frequency of the unmodulated carrier of the selected channel.

The output of bandpass filter 90 is connected to the input of a wideband amplifier 32 (having, for example, a bandwidth of 500 Mhz approximately 1.15 GHz) whose two outputs are connected, on the one hand, to the first or signal input of the first phase comparator 140 belonging to the demodulator loop 120 and, on the other hand, to a control circuit 33 for the variable attenuator 31. This control circuit 33 comprises a detector for detecting the amplitude (or peaks) of the modulated carrier, a low-pass filter (or integrator) and, eventually, a DC amplifier (these two latter elements may be combined into an active low-pass filter), whose output supplies the gain-control input 34 of attenuator 31 with a DC voltage proportional to the amplitude of the carrier so that its attenuation (reverse of the gain) is also proportional. Thus very efficient automatic gain-control is obtained, which ensures for the modulated carrier applied to demodulator 120 a substantially constant amplitude for variations in a wide range of the receiver input signal strength.

The second input of the first phase comparator 140 is connected to the output of the single voltage-controlled oscillator (VCO) 150 which is common to both the demodulator loop 120 and to the frequency synthesizer loop 110 of the receiver and which must be able to oscillate approximately within the 0.9 to 1.4 GHz frequency band. This is important for the choice of the components used (high-frequency transistors, variable-capacitor diodes) and of the configuration of the first phase comparator 140 which is preferably a symmetrical mixer (of the ring type, for example, also called "balanced mixer") and, therefore, nonlinear, as described in the above-mentioned article by BREMENSON et al.

The output of the first phase comparator 140 is connected to the input of a first passive low-pass filter 160 whose passband must include the entire frequency band (spectrum) of the composite color video signal (from 50 Hz up to about 5 MHz) as well as that of the frequency-modulated sound subcarrier (at 5.5 MHz). This first filter 160 may be in the form of a bandpass filter whose lower cut-off frequency would be less than 50 Hz and whose upper cut-off frequency would be greater than 5.3 MHz, for example. It may then comprise a series-coupling capacitor inserted in the so-called "error-signal" path of the signal delivered by the first comparator 140. The output of the first low-pass or bandpass filter 160 is coupled, for example, by means of a video amplifier 170, to a first input of an analog adder 39 which adds or combines the signals or voltages from the two loops 110 and 120, so as to apply the sum thereof to the frequency control input of the voltage-controlled oscillator 150.

The output of this oscillator 150 is also coupled, through a prescaler 22 and a programmable divider 23 mounted in cascade, to the first input of the second phase (and frequency) comparator 25 which operates at a frequency substantially lower than the first phase comparator 140. The other input of the second phase comparator 25 is supplied by the reference oscillator 26 which is controlled by a crystal 27, through a so-called "reference" frequency divider 38 having a constant dividing factor (R).

It should be noted here that the second phase comparator 25 may be advantageously formed by a hybrid integrated circuit of the MC-4344 or MC-4044 type manufactured in United States by "MOTOROLA SEMICONDUCTOR PRODUCTS, INC.", called "PHASE-FREQUENCY DETECTOR".

The output of the second comparator 25 feeds a second low-pass filter 28 and a DC amplifier 29 in cascade, which may be combined together into an active low-pass filter including an integrated operational amplifier, for example (see the above-mentioned article by BREMENSON et al.), whose output feeds the second input of the analog adder circuit 29 so as to close the synthesizer loop and thus to combine both the frequency synthesizer and demodulator loops by means of the single voltage-controlled oscillator 150. The upper cut-off frequency of the second low-pass filter 28 (less than 1 kHz in the above-mentioned article by BREMENSON et al.), which is inversely proportional to its integration time constant, is chosen here preferably to be lower than the frame frequency (50 or 60 Hz) of the television signals, so that the longer response time of the synthesizer loop 110 which determines the average frequency of the voltage-controlled oscillator (VCO) 150, allows the latter to deliver a variable frequency depending on the signal modulating the carrier wave, i.e. on the instantaneous amplitude of the composite video signal and of the superimposed sound subcarrier, supplied by the first low-pass filter 160. In other words, the time constant of the synthesizer loop filter 28 is chosen in such a way as to allow the frequency of the voltage-controlled oscillator 150 to follow the frequency deviations of the frequency-modulated carrier wave applied to the input of the demodulator loop 120, and this about a central frequency determined by the synthesizer loop 110. This central frequency is then little different from the resting frequency (without modulating signal) of the carrier wave of the channel selected by means of the programmable divider, because the locking range of the combined frequency demodulator and synthesizer of the invention is, due to the presence of the synthesizer loop 110 which allows the frequency of the single voltage-controlled oscillator 150 to be maintained at a given value even in the absence of a received wave, made substantially narrower than that of the conventional phase-locked loop demodulator 12 of FIG. 1.

It will be noted here that, because of the high gain of demodulator loop 120, determined by the sensitivity of the voltage-controlled oscillator 150, which is of the order of 100 MHz/volt, the video-frequency amplifier 170 may possibly be transferred beyond of the output 19 the demodulator (see in the above-mentioned article by BREMENSON et al.).

In an advantageous embodiment of the receiver having a demodulator and a tuner (channel selector) comprising the above-described combined frequency demodulator and frequency synthesizer including two phase-locked loops (PLL), the digital control circuit 24 which controls the variable dividing factor (N) of the programmable divider 23 may also serve for controlling the tuning of the voltage-tunable bandpass filter 90 so that the central frequency of its narrow passband (20 MHz) corresponds substantially to the resting frequency of the (unmodulated) carrier wave of the selected channel as well as to that of the voltage-controlled oscillator 150 as controlled by the synthesizer loop 110 (in the absence of an input signal). To this end, the parallel outputs of the digital control circuit 24 are also connected to the parallel address inputs of a programmable read-only memory (or PROM) 35 whose parallel data outputs respectively feed the parallel inputs of a digital-to-analog converter 36. The read-only memory 35 is previously programmed so as to supply, when it is addressed by a word corresponding to a given transmission channel number, a control word composed of binary digits and corresponding to a predetermined DC tuning voltage level at the output 37 of the D/A converter 36, such that the central frequency of filter 90 becomes substantially equal to that of the selected channel. The output 37 of the D/A converter 36 is then connected to the tuning control input 91 of the voltage-tunable filter 90 so as to reverse bias the variable capacitor diode(s) which it comprises.

It should be noted that the operating frequency range depends on the range of the dividing factors of the programmable divider 23.

It will also be noted here that the combined phase-locked loop frequency demodulator and synthesizer may also be applied to a receiver of frequency modulated waves situated in a frequency band lower than 1.5 GHz. In this case, the input mixer-converter 3, 4 of the radio-frequency head 6 may be omitted and the antenna 1 directly connected to a radio-frequency amplifier with low noise figure and, possibly, with controllable gain, which may be preceded and/or followed by a tunable filter similar to filter 90.

What is claimed is:

1. A frequency demodulator and synthesizer device for a frequency-modulated carrier-wave receiver, comprising first and second phase-locked loops acting on a single voltage-controlled oscillator, said first loop being a conventional frequency synthesizer loop for selecting a frequency corresponding to one of a plurality of received modulated carrier waves, which is to be demodulated, said first loop being combined with said second loop, which is a conventional demodulator loop having a first phase comparator receiving at its signal input at least said one of the modulated carrier waves and at its other input, the wave supplied by the oscillator, said demodulator loop providing a demodulated signal at an output thereof.

2. A device as claimed in claim 1, wherein said synthesizer loop comprises a frequency divider fed by said oscillator and including in cascade a prescaler having a constant dividing factor and a programmable divider having a variable dividing factor controlled by means of a digital control circuit, a second phase comparator fed, on the one hand, by said programmable divider and, on the other hand, by a fixed-frequency crystal-controlled reference oscillator, and a first low-pass filter fed by the output of the second phase comparator and delivering a first error signal intended for the local oscillator frequency control input, and wherein said demodulator loop comprises, in addition to the first phase comparator, a second low-pass filter fed by the first comparator and delivering a second signal corresponding to the demodulated signal, and wherein said device further comprises an analog adder circuit for adding said second signal to said first error signal, having an output feeding the frequency control input of said local oscillator, which thus receives the sum of the two signals.

3. A device as claimed in claim 2, wherein the upper cut-off frequency of the first low-pass filter of said synthesizer loop is selected lower than the lowest frequency of the signal modulating the received carrier wave which, for a composite video signal, is formed by the frame frequency, the bandwidth of the second filter of said demodulator loop being chosen to cover the entire frequency spectrum of said modulating signal including a composite video signal and a superimposed sound subcarrier.

4. A device as claimed in any one of claims 2 and 3, further comprising, inserted in the path of the received modulated carrier wave, ahead of the signal input of said first phase comparator, a bandpass filter tunable by means of a DC tuning voltage applied to a tuning control input thereof, within a frequency band including a plurality of transmission channels and whose bandwidth comprises the spectrum of the carrier wave and of its modulation components, said tunable bandpass filter being tuned simultaneously with the selection of the channel by means of a control signal delivered by said digital control circuit for controlling said programmable divider.

5. A device as claimed in claim 4, wherein parallel outputs of said digital control circuit also respectively supply parallel address inputs of a programmable read-only memory whose parallel outputs respectively supply parallel inputs of a digital-to-analog converter whose output supplies the tuning voltage to the tuning control input of the voltage-tunable filter.

6. A device as claimed in claim 1, further comprising, inserted in the path of the received modulated carrier wave, ahead of the signal input of said first phase comparator, a variable-gain stage having a gain-control input supplied with a DC gain-control signal whose level is proportional to the peak amplitude of the modulated carrier wave supplied by the output of said stage, said gain-control signal controlling the gain of said variable gain stage so as to maintain the amplitude of the output signal of said stage substantially constant for a wide range of amplitudes of its input signals.

* * * * *